(12) United States Patent
Endoh et al.

(10) Patent No.: US 8,114,247 B2
(45) Date of Patent: Feb. 14, 2012

(54) PLASMA PROCESSING APPARATUS AND FOCUS RING

(75) Inventors: Shosuke Endoh, Nirasaki (JP); Shinji Himori, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/941,701

(22) Filed: Nov. 8, 2010

(65) Prior Publication Data

US 2011/0048643 A1 Mar. 3, 2011

Related U.S. Application Data

(62) Division of application No. 10/751,898, filed on Jan. 7, 2004, now Pat. No. 7,850,174.

(30) Foreign Application Priority Data

Jan. 7, 2003 (JP) .................. 2003-001547

(51) Int. Cl.
*H01L 21/3065* (2006.01)
*H01L 21/205* (2006.01)

(52) U.S. Cl. ............... 156/345.51; 118/728; 361/234; 279/128

(58) Field of Classification Search .......... 118/723 R, 118/723 VE, 728; 156/345.51; 361/234; 279/128

See application file for complete search history.

(56) References Cited

U.S. PATENT DOCUMENTS

| | | |
|---|---|---|
| 5,740,009 A | 4/1998 | Pu et al. |
| 5,904,778 A | 5/1999 | Lu et al. |
| 5,919,332 A | 7/1999 | Koshiishi et al. |
| 6,159,299 A | 12/2000 | Koai et al. |
| 6,251,215 B1 | 6/2001 | Zuniga et al. |
| 6,284,093 B1 | 9/2001 | Ke et al. |
| 6,391,787 B1 | 5/2002 | Dhindsa et al. |
| 6,475,336 B1 | 11/2002 | Hubacek |
| 6,489,249 B1 | 12/2002 | Mathad et al. |
| 6,554,954 B2 | 4/2003 | Ma et al. |
| 6,689,249 B2 | 2/2004 | Ke et al. |
| 6,824,627 B2 | 11/2004 | Dhindsa et al. |
| 2003/0106646 A1 | 6/2003 | Ma et al. |
| 2004/0083975 A1 | 5/2004 | Tong et al. |
| 2004/0134618 A1 | 7/2004 | Endoh et al. |

(Continued)

FOREIGN PATENT DOCUMENTS

JP 11-16891 1/1999

(Continued)

OTHER PUBLICATIONS

Machine Generated English Translation of JP 2002-241946 published Aug. 28, 2002.*

*Primary Examiner* — Sylvia R. MacArthur
(74) *Attorney, Agent, or Firm* — Oblon, Spivak, McClelland, Maier & Neustadt, L.L.P.

(57) ABSTRACT

A plasma processing apparatus and a focus ring enables to perform uniform plasma processing over the entire surface of a substrate to be processed to thereby improve in-surface uniformity of plasma processing compared with conventional cases. The focus ring is disposed on a susceptor 2, which serves to mount thereon a semiconductor wafer W and further functions as a lower electrode, to surround a periphery of the semiconductor wafer W. The focus ring 6 includes a ring member of a thin plate shape disposed to surround the periphery of the wafer W while maintaining a gap therebetween and a lower ring body installed below the semiconductor wafer and the ring member of the thin plate shape.

5 Claims, 4 Drawing Sheets

U.S. PATENT DOCUMENTS

| | | |
|---|---|---|
| 2004/0159287 A1 | 8/2004 | Hoffman et al. |
| 2005/0005859 A1 | 1/2005 | Koshiishi et al. |
| 2005/0056622 A1 | 3/2005 | Steger |
| 2005/0133164 A1 | 6/2005 | Fischer et al. |

FOREIGN PATENT DOCUMENTS

| | | |
|---|---|---|
| JP | 2002-110652 | 4/2002 |
| JP | 2002-241946 | 8/2002 |
| JP | 2002-246370 | 8/2002 |

* cited by examiner

FIG.8 ically different impedance per unit area of the focus ring to that of the substrate.

Not satisfied by anything.

PLASMA PROCESSING APPARATUS AND FOCUS RING

CROSS-REFERENCE(S) TO RELATED APPLICATIONS

This application is a divisional of pending U.S. application Ser. No. 10/751,898, filed on Jan. 7, 2004, which claims priority to Japanese Patent Application No. 2003-001547, filed on Jan. 7, 2003, the entire contents of both of which are incorporated herein by reference.

FIELD OF THE INVENTION

The present invention relates to a plasma processing apparatus and a focus ring employed therein for use in performing a predetermined processing such as a plasma etching on a substrate to be processed, e.g., a semiconductor wafer.

BACKGROUND OF THE INVENTION

Plasma processing has been conventionally employed in the manufacture of a semiconductor device, an LCD (liquid crystal display), or the like to carry out a predetermined processing, e.g., film formation, etching processing, or the like on a substrate to be processed, such as a semiconductor wafer or an LCD substrate, by using a plasma.

In case of a plasma etching process employing a parallel plate type etching apparatus, for example, a substrate to be processed is mounted on a mounting table (susceptor) installed in a plasma processing chamber, and a plasma etching is executed by allowing a plasma generated within the plasma processing chamber to act on the substrate to be processed. Conventionally, a so-called focus ring is disposed to surround the substrate to be processed in conducting such a plasma etching process for the purpose of, e.g., enhancing an in-surface uniformity of the plasma etching process by ameliorating a discontinuity of the plasma at a peripheral portion of the substrate to thereby improve an etching quality thereat (see, e.g., Japanese Patent Laid-open Publication No. 2002-246370, pages 2 to 5, FIGS. 1 to 6).

Figure 8:
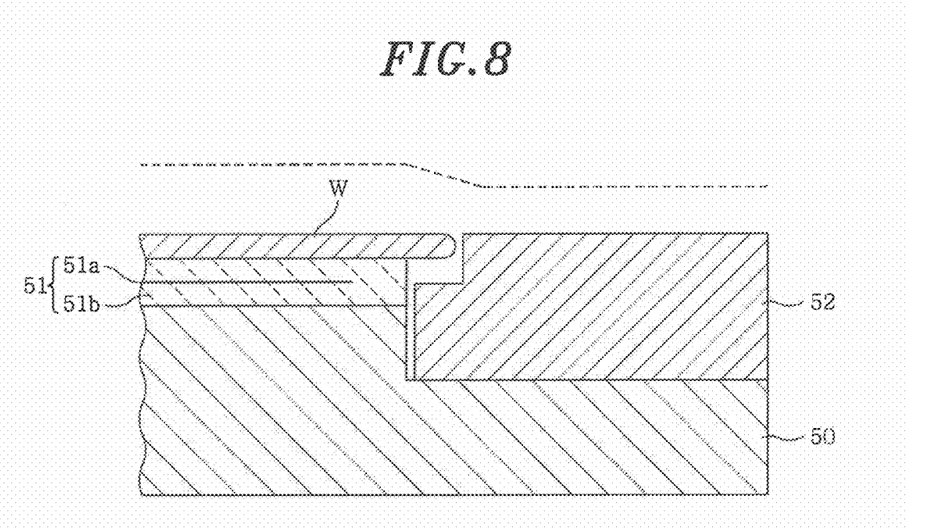
FIG. 8 illustrates a schematic configuration of main parts of a prior art plasma processing apparatus.

Referring to FIG. 8, there is illustrated a configuration of main parts of the parallel plate type etching apparatus performing such a plasma etching process. In FIG. 8, a reference numeral 50 represents a mounting table (susceptor) disposed in a plasma processing chamber (not shown).

The susceptor 50 further serves as a lower electrode and is of a substantially disk shape made of a conductive material, e.g., having an anodic oxide film (alumite) formed at the surface thereof.

Provided on a wafer mounting surface of the susceptor for mounting thereon a semiconductor wafer W is an electrostatic chuck 51 including an electrode 51a embedded in an insulating film 51b formed of an insulating material. Further, an annular focus ring 52 is disposed on the susceptor 50 to surround the semiconductor wafer W.

The susceptor 50 is formed of, e.g., aluminum as described above. Therefore, if there exists on the susceptor 50 a portion directly exposed to plasma formed above the semiconductor wafer W, that portion may be sputtered by the plasma, and as a result an undesirable sputtered film containing, e.g., aluminum, may be formed on the semiconductor wafer W.

For this reason, a diameter of the wafer mounting surface (where the electrostatic chuck 51 is formed) of the susceptor 50 is set to be slightly (for example, about 4 mm) smaller than that of the semiconductor wafer W, as illustrated in FIG. 8. Further, by setting the inner diameter of a lower part of the focus ring 52 to be smaller than the diameter of the semiconductor wafer W, the lower part of the focus ring 52 is extended to a space below a peripheral portion of the semiconductor wafer W such that none of the top surface of the susceptor 50 is directly exposed when viewed from the top.

The top surface of the focus ring 52 is set to be substantially level with the top surface of the semiconductor wafer W. Therefore, a total thickness of the focus ring 52 is far thicker than that (e.g., about 0.8 mm) of the semiconductor wafer W.

As described above, in the conventional plasma processing apparatus, the focus ring is installed around the periphery of the substrate to be processed, to improve in-surface uniformity of plasma etching. However, there is still a need to further enhance the in-surface uniformity of plasma etching, which has not been satisfied with the plasma processing apparatus using such a focus ring.

SUMMARY OF THE INVENTION

It is, therefore, an object of the present invention to provide a plasma processing apparatus capable of performing uniform plasma processing over the entire surface of a substrate to be processed to thereby improve in-surface uniformity of plasma processing compared with conventional cases, and a focus ring employed therein.

In accordance with a first aspect of the present invention, there is provided a plasma processing apparatus comprising:
a plasma processing chamber;
a susceptor installed within the plasma processing chamber for mounting thereon a substrate to be processed;
a ring member disposed to surround a periphery of the substrate to be processed with a gap therebetween; and
a lower ring body placed below the substrate to be processed and the ring member.

In accordance with a second aspect of the present invention, there is provided the plasma processing apparatus described in the first aspect, wherein a ratio of an impedance per unit area of the ring member to that of the substrate to be processed is equal to or less than about 5.

In accordance with a third aspect of the present invention, there is provided the plasma processing apparatus described in the second aspect, wherein the ratio of the impedance per unit area of the ring member to that of the substrate to be processed is equal to or less than about 3.

In accordance with a forth aspect of the present invention, there is provided the plasma processing apparatus described in the third aspect, wherein the ratio of the impedance per unit area of the ring member to that of the substrate to be processed is equal to or less than about 1.5.

In accordance with a fifth aspect of the present invention, there is provided the plasma processing apparatus described in the first aspect, wherein the ring member is made of a material having an impedance substantially identical to that of the substrate to be processed and a thickness of the ring member is equal to or less than about five times a thickness of the substrate to be processed.

In accordance with a sixth aspect of the present invention, there is provided the plasma processing apparatus described in the first aspect, wherein the ring member is made of the same material as that forming the substrate to be processed and a thickness of the ring member is equal to or less than about five times a thickness of the substrate to be processed.

In accordance with a seventh aspect of the present invention, there is provided the plasma processing apparatus described in the sixth aspect, wherein the substrate to be processed is a semiconductor wafer made of silicon and having a thickness of about 0.8 mm and the ring member is made of silicon and has a thickness not greater than about 4 mm.

In accordance with an eighth aspect of the present invention, there is provided the plasma processing apparatus described in the sixth aspect, wherein the substrate to be processed is a semiconductor wafer made of silicon and the ring member is made of silicon and has a thickness substantially identical to that of the semiconductor wafer.

In accordance with a ninth aspect of the present invention, there is provided the plasma processing apparatus described in the first aspect, wherein the ring member is formed of SiC, aluminum having a thermally sprayed coating formed on a surface thereof, quartz or ceramics.

In accordance with a tenth aspect of the present invention, there is provided the plasma processing apparatus described in the first aspect, wherein the susceptor includes a conductive lower electrode and the ring member is formed on a surface of the lower electrode by thermal spraying.

In accordance with an eleventh aspect of the present invention, there is provided the plasma processing apparatus described in the first aspect, wherein the lower ring body serves to protect the susceptor from a plasma generated within the plasma processing chamber.

In accordance with a twelfth aspect of the present invention, there is provided a plasma processing apparatus comprising:

a plasma processing chamber;

a susceptor installed within the plasma processing chamber for mounting thereon a substrate to be processed;

a ring member disposed to surround a periphery of the substrate to be processed with a gap therebetween; and an electrostatic chuck formed on the susceptor to be located below the substrate to be processed and the ring member.

In accordance with a thirteenth aspect of the present invention, there is provided a plasma processing apparatus comprising:

a plasma processing chamber;

a susceptor installed within the plasma processing chamber for mounting thereon a substrate to be processed; and a ring member disposed to surround a periphery of the substrate to be processed with a gap therebetween, wherein a ratio of an impedance per unit area of the ring member to that of the substrate to be processed is equal to or less than about 5.

In accordance with a fourteenth aspect of the present invention, there is provided a focus ring disposed on a susceptor to surround a periphery of a substrate to be processed, the susceptor being installed within a plasma processing chamber of a plasma processing apparatus, the focus ring comprising:

a ring member disposed to surround the periphery of the substrate to be processed with a gap therebetween; and a lower ring body placed below the substrate to be processed and the ring member.

In accordance with a fifteenth aspect of the present invention, there is provided the focus ring described in the fourteenth aspect, wherein a ratio of an impedance per unit area of the ring member to that of the substrate to be processed is equal to or less than about 5.

In accordance with a sixteenth aspect of the present invention, there is provided the focus ring described in the fourteenth aspect, wherein the ring member is made of a material having an impedance substantially identical to that of the substrate to be processed and a thickness of the ring member is equal to or less than about five times a thickness of the substrate to be processed.

In accordance with a seventeenth aspect of the present invention, there is provided the focus ring described in the fourteenth aspect, wherein the ring member is made of the same material as that forming the substrate to be processed and a thickness of the ring member is equal to or less than about five times a thickness of the substrate to be processed.

In accordance with an eighteenth aspect of the present invention, there is provided the focus ring described in the fourteenth aspect, wherein the ring member is formed of SiC, aluminum having a thermally sprayed coating formed on a surface thereof, quartz, or ceramics.

In accordance with a nineteenth aspect of the present invention, there is provided the focus ring described in the fourteenth aspect, wherein the ring member is formed at a surface of a conductive lower electrode by thermal spraying.

In accordance with a twentieth aspect of the present invention, there is provided a focus ring disposed on a susceptor to surround a periphery of a substrate to be processed, the susceptor being installed within a plasma processing chamber of a plasma processing apparatus, the focus ring comprising:

a ring member disposed to surround the periphery of the substrate to be processed, wherein a ratio of an impedance per unit area of the ring member to that of the substrate to be processed is equal to or less than about 5.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The present invention will now be described in detail with reference to the accompanying drawings.

Figure 1:
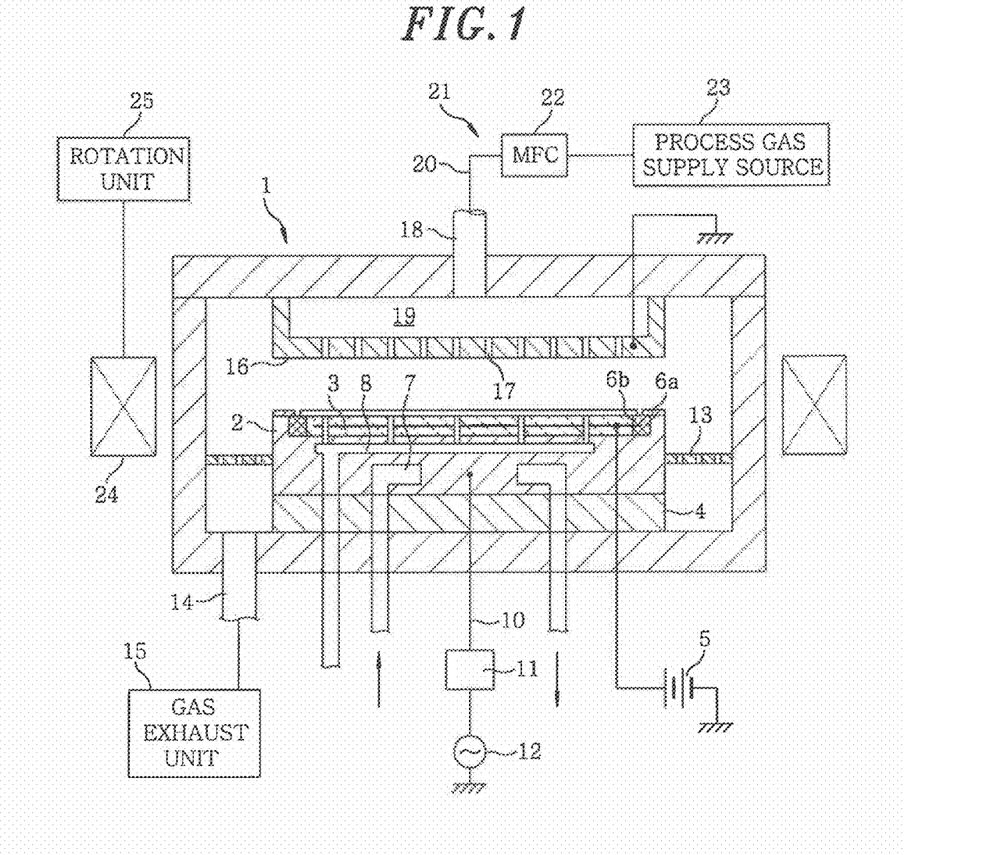
FIG. 1 illustrates a schematic configuration of a processing apparatus in accordance with a first preferred embodiment.

Referring to FIG. 1, there is illustrated a schematic configuration of a plasma processing apparatus (plasma etching apparatus) in accordance with a first preferred embodiment of the present invention. Reference numeral 1 represents a cylindrical processing chamber 1 forming a plasma processing room. The processing chamber 1 is made of, e.g., aluminum with an anodic oxide film (alumite) formed at the surface thereof, and the interior of the processing chamber 1 is configured to be hermetically sealed.

The processing chamber 1 is grounded and a susceptor (mounting table) 2 serving as a lower electrode is provided in the processing chamber 1. The susceptor 2 is made of, e.g., aluminum having an anodic oxide film (alumite) formed at the surface thereof.

Figure 2:
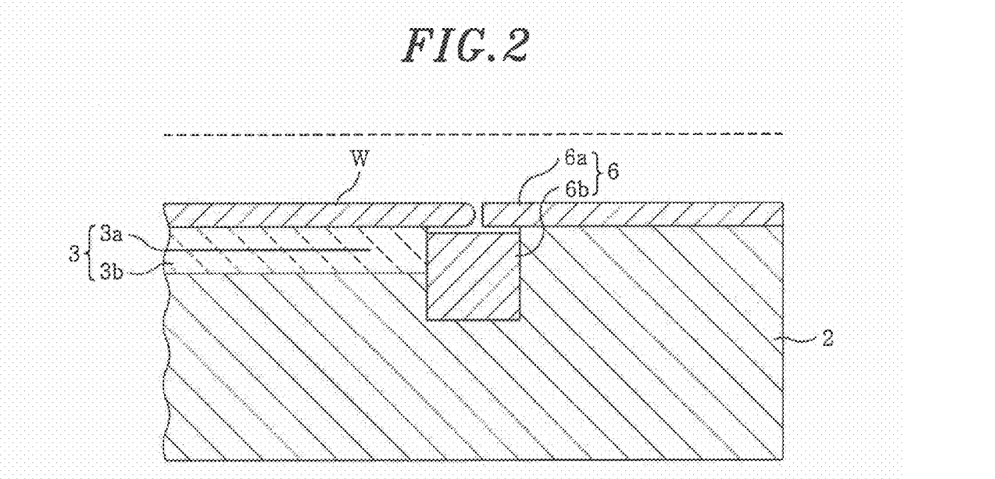
FIG. 2 describes a schematic configuration of main parts of the processing apparatus shown in FIG. 1.

Installed on a wafer-mounting surface of the susceptor 2 is an electrostatic chuck 3. As shown in FIG. 2, the electrostatic chuck 3 includes an electrode 3a embedded in an insulating film 3b formed of an insulating material, e.g., polyimide.

The susceptor 2 is supported in the processing chamber 1 in a state of vacuum via an insulating plate 4 such as ceramic, and the electrode 3a is connected to a DC power supply 5.

Further, an annular focus ring 6 is disposed on the susceptor 2 to surround the periphery of the semiconductor wafer W. The configuration of the focus ring 6 will be described later in detail.

Furthermore, formed within the susceptor 2 are a heat transfer medium path 7 for circulating an insulating fluid serving as a heat transfer medium for the control of the temperature of the susceptor 2 and a gas channel 8 for supplying a temperature control gas, e.g., a He gas, to the backside of the semiconductor wafer W.

By circulating the insulating fluid, which is regulated at a predetermined temperature, in the heat transfer medium path 7, the susceptor 2 is maintained at a preset temperature. Further, by supplying the temperature control gas between the susceptor 2 and the backside of the wafer W through the gas channel 8, a heat transfer therebetween is facilitated and, thus, the wafer W can be efficiently controlled to be maintained at a predetermined temperature with a high precision.

Further, connected around the center of the susceptor 2 is a feeder line 10 for supplying a high frequency power, which in turn is coupled via a matching unit 11 to a high frequency power supply (RF power supply) 12 for supplying a high frequency power of a predetermined frequency.

Furthermore, formed outside the periphery of the focus ring 6 is an annular exhaust ring 13 provided with a plurality of exhaust apertures. A processing space within the processing chamber 1 is evacuated to a predetermined vacuum level through the exhaust ring 13 by, e.g., a vacuum pump of a gas exhaust unit 15 coupled to a gas exhaust port 14.

Further, a grounded showerhead 16 is disposed above the susceptor 2 on a ceiling portion of the processing chamber 1 to face the susceptor 2 in parallel. Accordingly, the susceptor 2 and the showerhead 16 serve as a pair of electrodes (a lower electrode and an upper electrode, respectively).

The showerhead 16 is provided at a lower surface thereof with a plurality of gas injection openings 17 and has a gas inlet opening 18 at an upper portion thereof. Furthermore, formed within the showerhead 16 is a gas diffusion cavity 19. Connected to the gas inlet opening 18 is a gas supply line 20, which is led to a gas supplying system 21. The gas supplying system 21 includes a mass flow controller (MFC) 22 for controlling a gas flow rate and a process gas supply source 23 for supplying a process gas, e.g., etching.

An annular magnetic field forming mechanism (ring magnet) 24 is disposed around the processing chamber 1 to be concentric therewith, and serves to form a magnetic field in the processing space between the susceptor 2 and the showerhead 16. The magnetic field forming mechanism 24 is controlled to revolve about the processing chamber 1 by a rotation unit 25.

In the following, there will be provided a detailed description of the configuration of the focus ring 6 mentioned above. As shown in FIG. 2, the focus ring 6 includes a ring member 6a and a lower ring body 6b. The ring member 6a is of a thin plate shape and is disposed to surround the periphery of the semiconductor wafer W, while maintaining a predetermined gap therefrom. The lower ring body 6b is positioned between and below the semiconductor wafer W and the ring member 6a, so that the susceptor 2 is prevented from being directly exposed through the gap to a plasma in the processing space. The lower ring body 6b is accommodated in a groove formed in the susceptor 2 and serves to protect a surface thereof. Further, the lower ring body 6b is a consumable part consumed by a plasma and, thus, is replaceable.

Further, an impedance of the ring member 6a per unit area (a high frequency impedance) is set to be not greater than about five times that of the semiconductor wafer W.

In accordance with the first embodiment, both the ring member 6a and the lower ring body 6b are made of silicon, which is the same material as used to form the semiconductor wafer W. In such a case, by setting the thickness of the ring member 6a to be equal to or less than about five times (about 4.0 mm) the thickness (about 0.8 mm) of the semiconductor wafer W, the impedance per unit area of the ring member 6a can be adjusted to be not greater than about five times that of the semiconductor wafer W. In the first embodiment, however, the thickness of the ring member 6a is set to be substantially identical to that of the semiconductor wafer W, as shown in FIG. 2.

Accordingly, the impedance per unit area of the ring member 6a is also approximately identical to that of the semiconductor wafer W.

The reason for setting the impedance per unit area of the ring member 6a to be not greater than about five times that of the wafer W is as follows.

The inventors of the present invention conducted a series of experiments and found that there occurs a difference between sheath voltages formed above the wafer W and the focus ring 52, respectively, as indicated by a dotted line in FIG. 8, in case of employing the conventional focus ring 52 configured as shown in FIG. 8. Such discontinuity of the sheath voltages was considered to be one of the factors hampering a uniform processing of plasma etching at a peripheral portion of the wafer. Thus, it was expected that the uniformity of the etching processing would be improved by leveling the sheath voltages.

Further, the inventors viewed that the sheath voltages would be leveled by making the impedance per unit area of the focus ring approximate to that of the semiconductor wafer W, to enhance the uniformity of the etching. Three focus rings having thicknesses of about 8 mm, 4 mm, 2.4 mm, respectively, were fabricated by using silicon, which is the same material as that forming the semiconductor wafer W, and an etching processing was conducted for each case.

Figure 3:
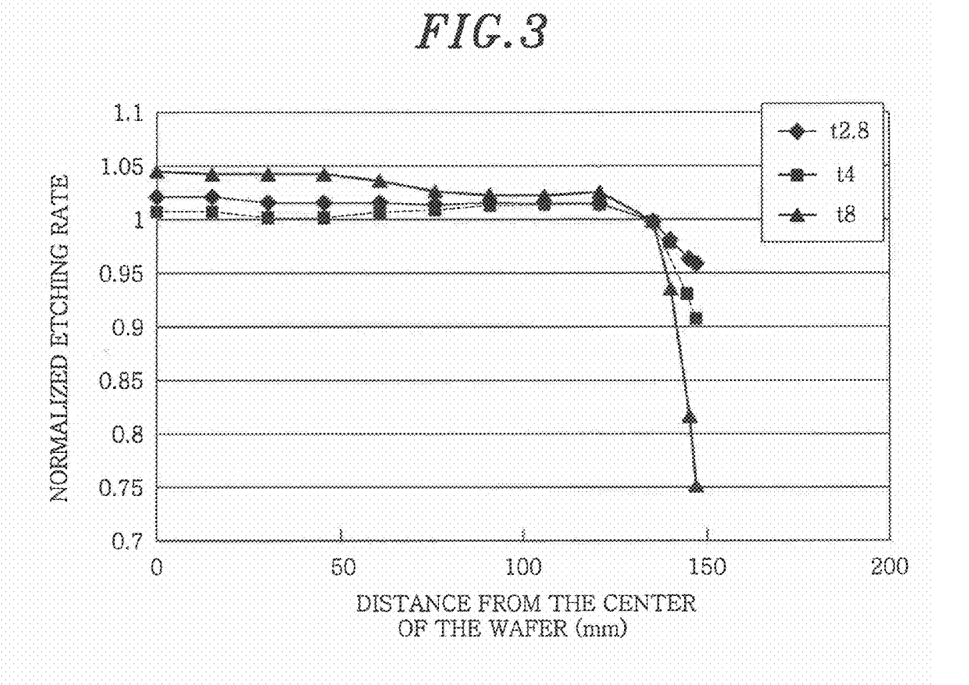
FIG. 3 shows a variation of a uniformity of etching rate as a function of a thickness of a focus ring.

FIG. 3 shows a result of such etching processes, wherein the vertical axis represents a normalized etching rate (normalized by an etching rate measured at a position about 135 mm apart from the center of the wafer), while the horizontal axis stands for a distance from the center of the wafer. As shown therein, it can be seen that a uniformity of the etching rate could be improved, especially at the peripheral portion of the wafer W, by employing a focus ring having a smaller thickness (thus, having an impedance per unit area closer to that of the semiconductor wafer).

Figure 4:
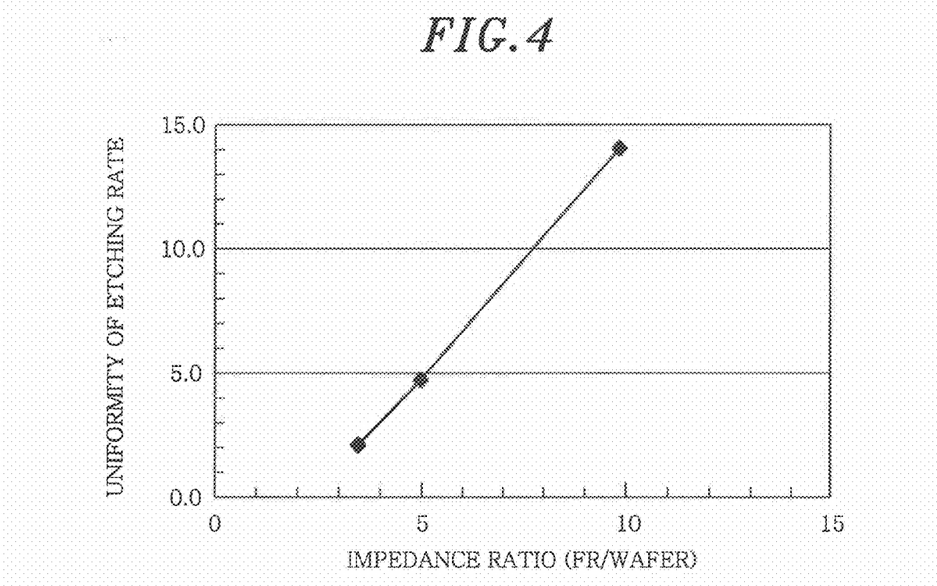
FIG. 4 illustrates a relationship between an impedance ratio and a uniformity of etching rate.

FIG. 4 also shows the experimental result with a vertical axis representing a uniformity (±%) of an etching rate at the peripheral portion of the wafer W and a horizontal axis defining an impedance ratio per unit area (an impedance per unit area of the focus ring/an impedance per unit area of the wafer W).

As shown in FIG. 4, by setting the impedance per unit area of the ring member 6a to be not greater than about five times that of the semiconductor wafer W, the uniformity of the etching rate can be controlled within ±5%, which is generally required in various manufacturing processes.

Furthermore, there may be required to maintain the uniformity of the etching rate within ±3% depending on manufacturing processes. Such requirement can be satisfied by setting the impedance per unit area of the ring member 6a to be not more than about four times that of the semiconductor wafer W.

Still further, the uniformity of the etching rate can be further enhanced by setting the impedance per unit area of the ring member 6a not to be greater than about 3 times or 1.5 times that of the semiconductor wafer W.

Though the first embodiment has been described for the case where the ring member 6a is made of the same material as that forming the semiconductor wafer W, i.e., silicon, it is also possible to form the ring member 6a by using another material such as SiC, aluminum with a thermally sprayed coating (e.g., a thermally sprayed coating of $Y_2O_3$) formed on the surface thereof, quartz, ceramics, or the like. In such a case, the relationship between the impedance ratio and the thickness would be different from that described above since a dielectric constant and a conductivity of the ring member are different from those of the semiconductor wafer W.

In fact, the semiconductor wafer W is formed of a silicon oxide film ($SiO_2$), a silicon nitride film (SiN), polysilicon, a metal film, a low-k film, and the like, in addition to the silicon substrate (Si). However, if the impedance of the semiconductor wafer W is predominantly dependent on an impedance of the silicon substrate (Si), the latter can be regarded as the impedance of the semiconductor wafer W, without having to consider an impedance of another material, e.g., the silicon oxide film ($SiO_2$).

Accordingly, a material (for example, silicon) having an impedance identical to that of the silicon substrate (Si) may be considered to have the same impedance as that of the semiconductor wafer W (a substrate to be processed). Further, in case of employing a material such as SiC having a controllable impedance in lieu of the silicon, it is possible to adjust the impedance of that material to be substantially identical to that of the silicon substrate (Si).

Further, in case of forming a coating of, e.g., $Al_2O_3$ or $Y_2O_3$, on the ring member 6a, an impedance of that coating need not be considered if its influence on the impedance per unit area of the whole ring member 6a is insignificant. However, the impedance of the coating may have a significant influence on the total impedance of the ring member 6a and the coating depending on a material (a basic material) forming the ring member 6a and the thickness thereof and, further, depending on a material forming the coating and its thickness. In such a case, it is required to determine the materials for the ring member 6a and the coating and the thickness thereof by considering the impedance that the coating might have.

As described above, the ring member 6a is thinner than, e.g., the conventional focus ring 52 illustrated in FIG. 8. In the first embodiment, particularly, the thickness of the ring member 6a is set to be substantially identical to that of the semiconductor wafer W. Therefore, it is impossible to arrange a part of the ring member 6a to be disposed below the peripheral portion of the semiconductor wafer W. Thus, in the first embodiment, the focus ring 6 is designed to further include the lower ring body 6b in addition to the ring member 6a.

By disposing the lower ring body 6b between and below the semiconductor wafer W and the ring member 6a, the susceptor 2 can be protected.

Figure 5:
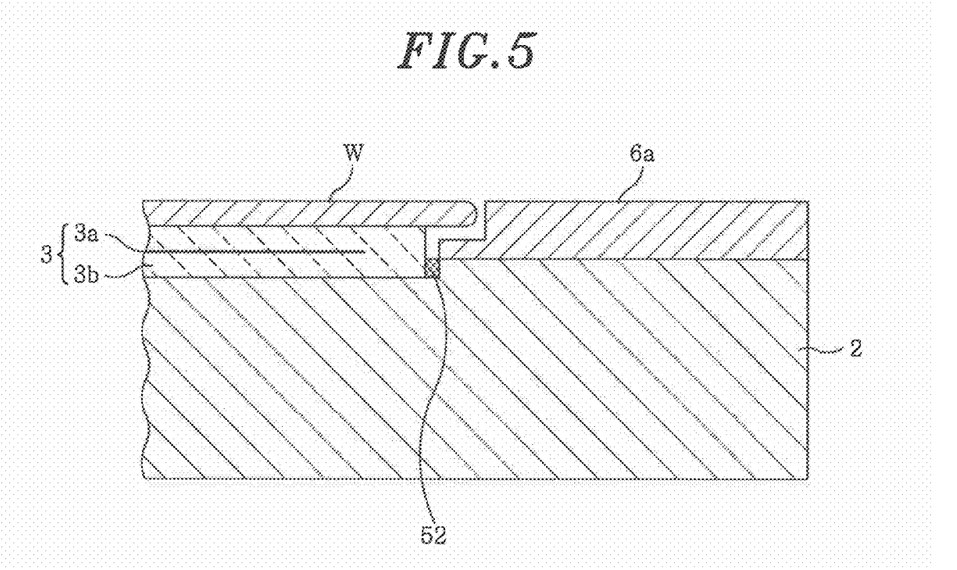
FIG. 5 describes an exemplary modified schematic configuration of the main parts of the processing apparatus of FIG. 1.

Further, by forming a mounting surface for the ring member 6a to be higher than a mounting surface for the electrostatic chuck 3 and placing a thermally sprayed coating 62 at a portion where the susceptor 2 between the electrostatic chuck 3 and the ring member 6a is exposed to the plasma, as shown in FIG. 5, the lower ring body 6b is not required even in case the focus ring is of a shape similar to that of the conventional focus ring 52 illustrated in FIG. 8. In FIG. 5, the ring member 6a is made of silicon and its thickness is set to be about twice as large as that of the semiconductor wafer W. And the focus ring in FIG. 5 is formed of the ring member 6a only, unlike the focus ring 6 shown in FIGS. 1 and 2 having the ring member 6a and the lower ring body 6b.

Figure 6:
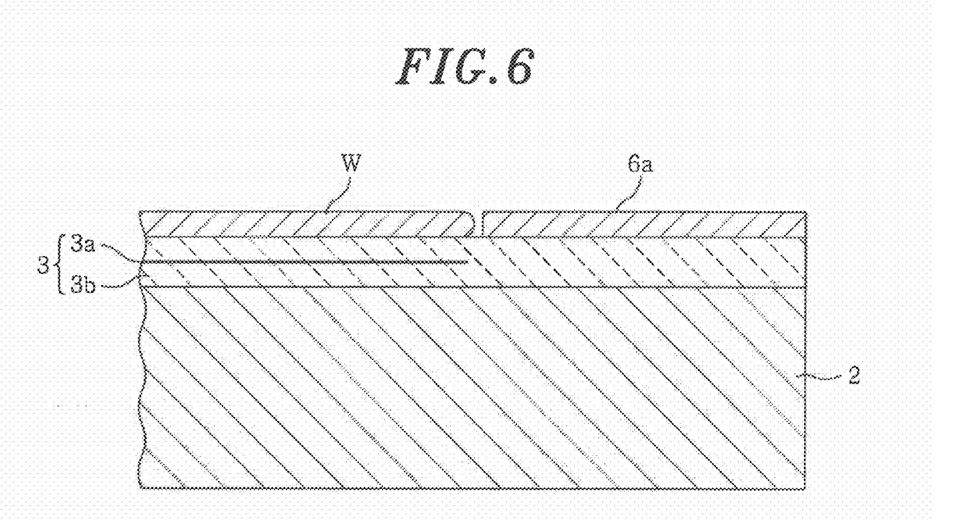
FIG. 6 shows another exemplary modified schematic configuration of the main parts of the processing apparatus of FIG. 1.

Further, as shown in FIG. 6, it may be preferable to set the diameter of the electrostatic chuck 3 installed at the mounting surface for the semiconductor wafer W to be virtually identical to that of the susceptor 2 and locate the electrostatic chuck 3 under the semiconductor wafer W and the ring member 6a. In such a case, the lower ring body 6b is not needed, and the ring member 6a is mounted on the electrostatic chuck 3 together with the semiconductor wafer W. By employing this configuration, a simple structure can be obtained capable of protecting the susceptor 2 from the plasma without recourse to the lower ring body 6b. Further, the focus ring provided in FIG. 6 is also formed of only the ring member 6a unlike the focus rings illustrated in FIGS. 1 and 2 having the ring member 6a and the lower ring body 6b.

Since the thickness of the ring member 6a is configured to be approximately identical to that of the semiconductor wafer W in the first embodiment, shown in FIGS. 2 and 6 as described above, a height of the mounting surface of the susceptor 2 for the ring member 6a can be made to be substantially identical to that of the mounting surface of the susceptor 2 for the semiconductor wafer W. Accordingly, lapping of both the mounting surface can be carried out simultaneously, thereby reducing a processing cost while improving a precision of the processing.

Further, a dotted line depicted in FIG. 2 represents a sheath voltage formed above the semiconductor wafer W and the ring member 6a.

In the following, there will be described a processing sequence of a plasma etching processing employing the plasma etching apparatus configured as described above.

First, a gate valve (not shown) provided on the processing chamber 1 is opened; and a semiconductor wafer W is carried by a transfer device (not shown) into the processing chamber 1 from a neighboring load lock chamber (not shown) and is mounted on the susceptor 2. Then, the transfer device is withdrawn from the processing chamber 1 and the gate valve is closed. A predetermined DC voltage is supplied from the DC power supply 5 to the electrode 3a of the electrostatic chuck 3, so that the wafer W is adsorbed to the electrostatic chuck 3 to be maintained thereon.

Thereafter, the processing chamber 1 is evacuated to a predetermined vacuum level, e.g., 1.33 Pa to 133 Pa, by the vacuum pump of the gas exhaust unit 15. At the same time, a predetermined etching gas is supplied into the processing chamber 1 from the process gas supplying system 21.

Then, a predetermined frequency, e.g., a high frequency ranging from ten to two hundred MHz exclusive, is supplied from the high frequency power supply 12 to the susceptor 2 via the matching unit 11. As a result, a plasma is generated in a space between the susceptor 2 and the showerhead 16 to thereby perform an plasma etching of the semiconductor wafer W.

In the first embodiment, a uniform sheath voltage is formed above the semiconductor wafer W and the focus ring 6, while etching the semiconductor wafer w by the plasma. Accordingly, a uniform plasma etching processing can be conducted on the entire surface of the semiconductor W, thereby improving an in-surface uniformity of the plasma etching processing compared to conventional cases.

Furthermore, since the thickness of the ring member 6a is smaller than that of the conventional one, a thermal capacity thereof is reduced, enhancing the response to a temperature change. Accordingly, though the plasma etching processing is conducted plural times, the temperature of the focus ring is maintained at a same level, so that the influence of the temporal change in the temperature of the focus ring on the plasma etching processing can be reduced.

Upon the completion of the predetermined etching of the semiconductor wafer W, the high frequency power from the high frequency power supply 12 is turned off to stop the plasma etching process and then the semiconductor wafer W is unloaded from the processing chamber 1 in a reverse order of the above-described sequence.

Figure 7:
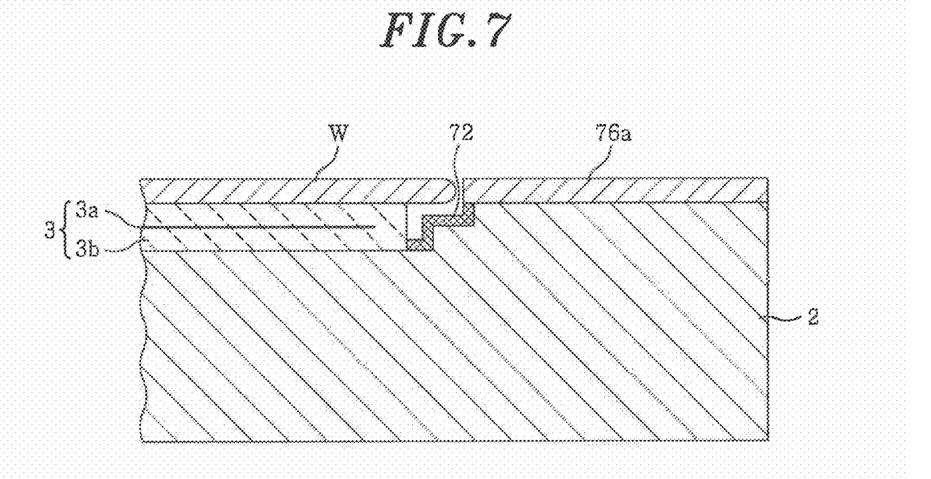
FIG. 7 explains a schematic configuration of main parts of a processing apparatus in accordance with a second preferred embodiment of the present invention.

Hereinafter, a second preferred embodiment of the present invention will be described with reference to FIG. 7. In FIG. 7, a reference numeral 76a represents a thermally sprayed ring (a ring with a small thickness) formed by thermally spraying Si on a lower electrode (susceptor) 2 made of aluminum for example. A reference numeral 72 indicates a thermally sprayed coating of $Y_2O_3$ for covering a portion of the lower electrode exposed to the plasma.

In the second embodiment, the thermally sprayed ring 76a is employed in lieu of the ring member 6a of the thin plate shape used in the first embodiment. Since the thermally sprayed ring 76a is formed on the electrode by the thermal spraying of Si, the thickness of the thermally sprayed ring 76a can be readily controlled to be substantially identical to that of the semiconductor wafer W. Accordingly, an impedance per unit area of the thermally sprayed ring 76a can be made to be substantially identical to that of the semiconductor wafer W.

The thermally sprayed ring 76a can be formed by an atmospheric plasma spraying method, a plasma spraying method, a high velocity flame spraying method, a detonation gun process method, or the like. Though it is preferable that the thermally sprayed ring 76a has a thickness virtually identical to that of the semiconductor wafer W, it is also possible to form the thickness of the thermally sprayed ring 76a to be smaller than that of the semiconductor wafer W since it is formed by thermal spraying. Furthermore, the thickness of the thermally sprayed ring 76a can be made to be larger than that of the semiconductor wafer W.

In addition, the material for the thermally sprayed ring 76a is not limited to Si. That is, the thermally sprayed ring 76a can also be formed of, e.g., SiC, $Y_2O_3$, $Al_2O_3$, $YF_3$, or the like. The thermally sprayed coating 72 can also be formed of Si, Sic, $Al_2O_3$, $YF_3$, or the like as in the case of the thermally sprayed ring 76a.

Furthermore, a focus ring disclosed in the second embodiment is formed of only the thermally sprayed ring 76 having the small thickness.

Though the preferred embodiments have been described for the case of applying the present invention to the plasma etching of the semiconductor wafer W, the present invention is not limited thereto. That is, the present invention can also be applied to, e.g., a plasma processing of an LCD substrate.

As described above, the present invention enables a uniform plasma processing over the entire surface of a substrate to be processed, thereby improving an in-surface uniformity of the plasma processing compared with conventional cases.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing apparatus comprising:
   a plasma processing chamber;
   a susceptor installed within the plasma processing chamber;
   an electrostatic chuck formed on the susceptor for mounting thereon a substrate to be processed wherein the electrostatic chuck is one continuous body; and
   a ring member disposed to surround a periphery of the substrate to be processed with a gap therebetween wherein the ring member comprises an electrically conductive material,
   wherein the whole ring member is located directly on the electrostatic chuck and a lower surface of the ring member is higher than an upper surface of the electrostatic chuck,
   wherein the electrostatic chuck has a first surface on which the substrate is directly mounted; and a second surface on which the ring member is directly mounted, the second surface being placed outside the first surface, and
   wherein a height of the first surface is substantially equal to a height of the second surface.

2. The apparatus of claim 1, wherein the entire upper surface of the susceptor is covered by the electrostatic chuck.

3. The apparatus of claim 1, wherein a height of a lower surface of the ring member is substantially equal to a height of a lower surface of the substrate to be processed.

4. The apparatus of claim 1, wherein a thickness of the ring member is equal to or less than 4.0 mm.

5. The apparatus of claim 1, wherein the chuck includes an electrode disposed below the first surface.

* * * * *